United States Patent
Eide (12)
(10) Patent No.: US 6,195,268 B1
(45) Date of Patent: *Feb. 27, 2001

(54) STACKING LAYERS CONTAINING ENCLOSED IC CHIPS

(76) Inventor: Floyd K. Eide, 3889 Mistral Dr., Huntington Beach, CA (US) 92649

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,435

(22) Filed: Feb. 26, 1998

Related U.S. Application Data (60) Provisional application No. 60/049,025, filed on Jun. 9, 1997, and provisional application No. 60/049,026, filed on Jun. 9, 1997.

(51) Int. Cl.[7] .......................... H01L 23/488; H01L 25/00
(52) U.S. Cl. ................. 361/803; 361/735; 257/686; 257/737; 257/778; 257/781; 228/180.22
(58) Field of Search ................... 174/52.1, 52.4; 257/678, 697, 723, 724, 685, 686, 777, 737, 738, 778, 780, 692, 693, 781; 361/735, 790, 803; 228/180.21, 180.22

(56) References Cited

U.S. PATENT DOCUMENTS

| | | | |
|---|---|---|---|
| 4,545,610 | * | 10/1985 | Lakritz et al. .................... 257/781 |
| 5,060,844 | * | 10/1991 | Behun ............................ 228/180.21 |
| 5,291,062 | * | 3/1994 | Higgins, III ...................... 257/693 |
| 5,311,402 | * | 5/1994 | Kobayashi et al. ................. 257/686 |
| 5,376,825 | * | 12/1994 | Tukamoto et al. .................. 257/686 |
| 5,550,403 | * | 8/1996 | Carichner ......................... 257/697 |
| 5,550,408 | * | 8/1996 | Kunitomo et al. .................. 257/737 |
| 5,579,207 | * | 11/1996 | Hayden et al. ..................... 361/790 |
| 5,600,541 | * | 2/1997 | Bone et al. ....................... 257/686 |
| 5,701,233 | * | 12/1997 | Caarson et al. .................... 257/686 |
| 5,783,870 | * | 7/1998 | Mostafazadeh et al. ............. 361/764 |
| 5,923,540 | * | 7/1999 | Asada et al. ....................... 361/764 |
| 5,956,233 | * | 9/1999 | Yew et al. ......................... 257/686 |
| 6,002,170 | * | 12/1999 | Kim et al. ........................ 257/686 |
| 6,043,430 | * | 3/2000 | Chun ............................... 257/686 |
| 6,064,120 | * | 5/2000 | Cobbley et al. .................... 257/781 |

FOREIGN PATENT DOCUMENTS 03-034445 * 2/1991 (JP).

* cited by examiner

Primary Examiner—Jeffrey Gaffin
Assistant Examiner—John B. Vigushin
(74) Attorney, Agent, or Firm—Myers, Dawes & Andras; Joseph C. Andras

(57) ABSTRACT

A structure and process are disclosed in which IC chip-containing layers are stacked to create electronic density. Each layer is formed with a cavity in which at least one IC chip is placed, electrically connected, and then covered to enclose the chip. Full tests to establish known good quality are performed on individual layers containing enclosed chips. Within each layer horizontal conducting traces connect with conductor-containing vias, in order to carry electrical signals vertically from layer to layer, and also to connect to a ball grid array on the bottom of the stack, the entire surface of which is available for I/O ports.

9 Claims, 7 Drawing Sheets

STACKING LAYERS CONTAINING ENCLOSED IC CHIPS

This application claims the benefit of U.S. Provisional Application No. 60/049,025, filed Jun. 9, 1997; and U.S. Provisional Application No. 60/049,026, filed Jun. 9, 1997.

BACKGROUND OF THE INVENTION

This invention relates to the stacking of layers containing IC chips, therby obtaining high density electronic circuitry. In general, the goal of the present invention is to combine high circuit density with reasonable cost. Cost reduction involves (a) relatively low cost initial forming of layers, (b) ability to use simple layer-testing techniques, and (c) effective ways of guaranteeing that defective layers will not be included in the stacks.

Another aspect of successful stacking of chip-containing layers is the availability of large numbers of input/output (I/O) terminals (or pads) for connecting the stack to external circuitry.

In most of the extensive prior art disclosures, the leads from the chip-embedded IC circuitry are brought out at one or more sides of the stack, i.e., at the periphery of the stacked layers. Some packages bring conductors from the IC circuitry through vertical vias extending to the bottom of the package, permitting the use of I/O pads on the bottom of the package, i.e., ball grid arrays of terminals on a single flat surface.

Hayden et al U.S. Pat. No. 5,579,207 shows a structure in which stacked chip-enclosing layers have vertically-extending vias serving as conductors between the IC chips and a plurality of pads on the top and bottom of the stack. Each layer substrate (chip carrier) in the Hayden et al patent has an IC chip mounted on its upper surface, and a cavity formed in its lower surface, which provides space for the IC chip on the layer below. The layers are separately formed and then stacked, using flat sealing strips around the peripheral edge between adjacent layers to provide sealing of the cavities, i.e., sealing occurs as a result of stacking. Because the Hayden et al patent extends the IC chip mounted on one carrier into the cavity of the next carrier, it is not possible to pretest the individual carriers as sealed, or covered, units.

What is not available in the prior art is a stack of IC-chip-containing layers which can be fully tested individually prior to stacking, and can connect the chip circuitry through vias to a ball grid array at the bottom of the stack, which array may if desired have terminals located at points throughout the full planar surface.

SUMMARY OF THE INVENTION

This application discloses two versions of fully pre-testable chip-containing layers, which can be stacked and have the chips electrically connected to a ball grid array on the bottom of the stack. One version, which is hermetically sealed, uses ceramic as the dielectric body material which provides the chip-containing cavity in each layer. The other version uses polyimide as the dielectric body material which provides the chip-containing cavity in each layer. In each version the individual layers are proved to be "known good" parts before stacking.

In each version, the dielectric layer material is laminated, so that electrical conductors (traces) can extend horizontally inside the dielectric material and be connected by wire bonding to I/O terminals on the chip die. Vias containing vertical conductors are formed in each stacked layer, which vias extend from top to bottom of the layer and intersect the appropriate horizontal traces. The vias also provide electrical conduction to an array of terminals located on the bottom of one layer, which terminals engage aligned terminals located on the top of the next layer.

Each layer is completed and enclosed before stacking, with the IC chip or chips inside the cavity, and covered on top either by a lid in a ceramic layer, or by epoxy which fills the cavity of a polyimide layer. Therefore, in order to provide good stack test yields and stack integrity, each enclosed chip may be conventionally tested and prepared prior to stacking of the layers, including:

(a) Tested at extreme temperatures (e.g., minus 55° C., plus 125° C.);

(b) Burned in (both temperature and bias); and (c) Environmentally screened (i.e., temperature cycle, thermal shock, humidity, bias).

If necessary, because the stack consists of completed IC packages, the stack can be conventionally reworked to remove defective layers, without compromising the integrity of the IC chips themselves.

The availability of the full bottom surface of the stack for terminals, and the virtually unlimited vertical interconnections, allow for a very high input/output (I/O) count accommodate the needs of the stacked ICs.

DETAILED DESCRIPTION OF THE PREFERRED EMBODIMENTS

FIGS. 1–7 relate to the ceramic version of the invention; and FIGS. 8–14 relate to the polyimide version of the invention.

Figure 1:
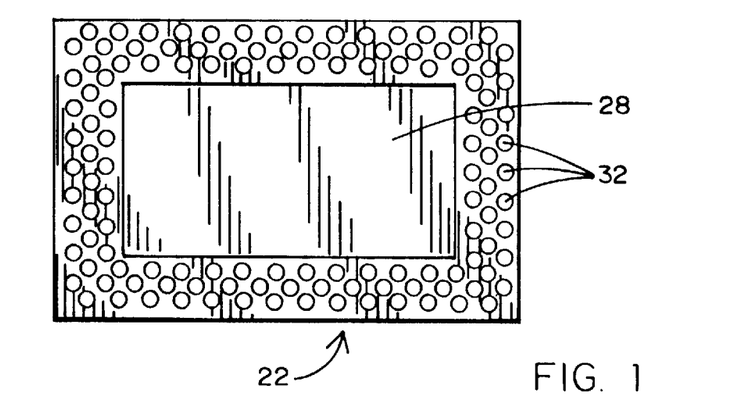
FIGS. 1–3 show, respectively, top, side, and bottom views of a stack of ceramic IC chip-enclosing layers.
Figure 2:
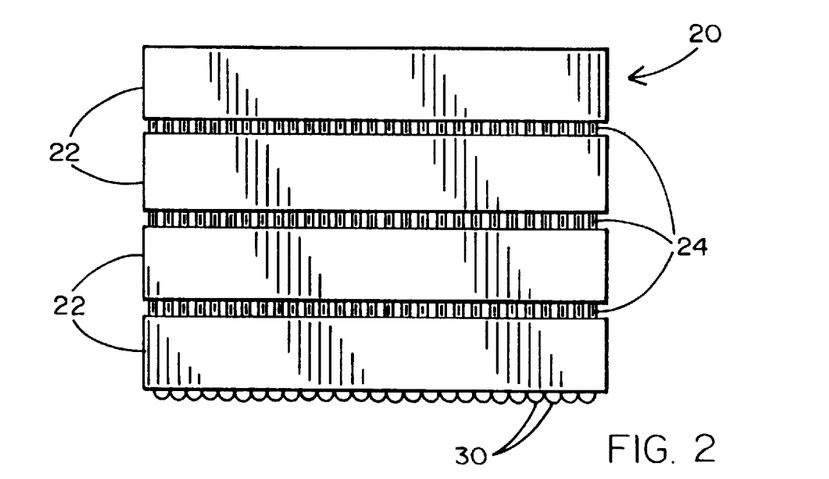
Figure 3:
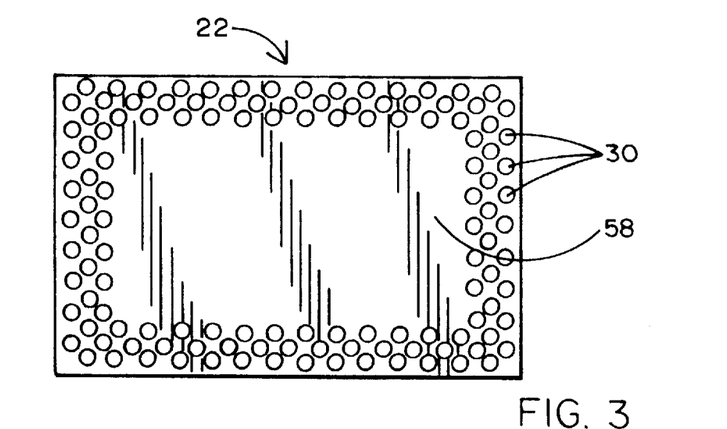

FIGS. 1–3 show a stack 20 of ceramic packages (or layers) 22, each of which encloses one or more IC chips. Four ceramic layers 22 are seen in FIG. 2; the number of layers can be varied as desired. The layer-enclosed semiconductor integrated circuits (ICs) are electrically and mechanically interconnected in the vertical direction. The end user of this stack will connect it to a substrate, such as a printed circuit board (PCB). The vertical placement of ICs will save considerable substrate area as opposed to conventional horizontal placement of an equivalent number of ICs on the substrate. Electrical and mechanical interconnection between adjacent layers is accomplished by columnar solder connections 24.

Figure 4:
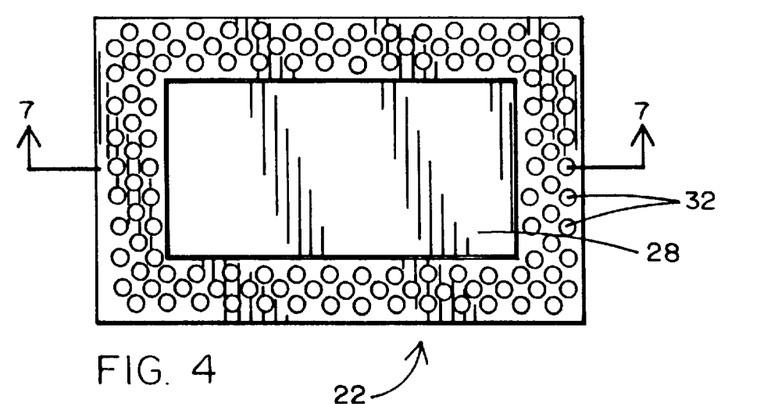
FIGS. 4–7 show, respectively, top, side, bottom, and vertical cross-section views of a single ceramic chip-enclosing layer.
Figure 7:
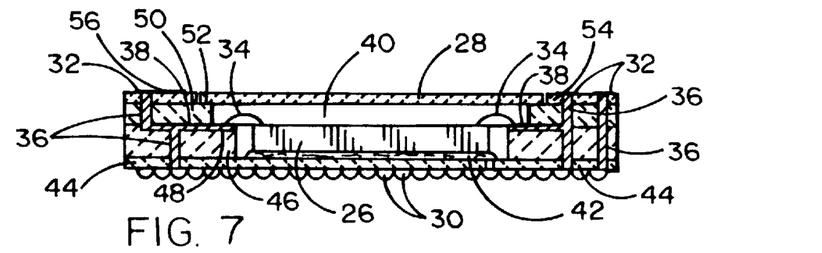

FIGS. 4 7 show views of a single layer. It is desirable from an economic standpoint to use identical layer structures, whenever feasible. The use of ceramic material to enclose the IC chips permits each layer and the stack of layers to be hermetically sealed. Each layer in the ceramic stack comprises a hermetically sealed co-fired multi-lamination ceramic layer 22 containing an IC chip die 26 attached and wire bonded within the package cavity. A lid 28 attached over this cavity provides a hermetic seal. The bottom surface of each ceramic package has an array 30 of metal bumps or balls called a ball grid array (BGA). The top surface of each ceramic package has a mechanically corresponding array of bumps or lands 32 called a land grid array (LGA). Wire bonding 34 (see FIG. 7) accomplishes electrical connection from IC chip bond pads to the package bond pads. Buried conductors within the ceramic package route the electrical connections from the package bond pads to either the balls 30 on the bottom surface of the package, or the lands 32 on the top surface of the package, or to both balls 30 and lands 32, by virtue of vias 36 connecting the buried conductors to the balls and/or lands. In the case of a dual ball and land connection, the ball and land need not be vertically aligned, thus allowing for electrical routing flexibility in the vertical direction within the stack when assembled.

Figure 5:
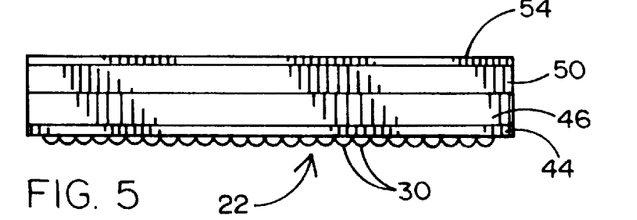
Figure 6:
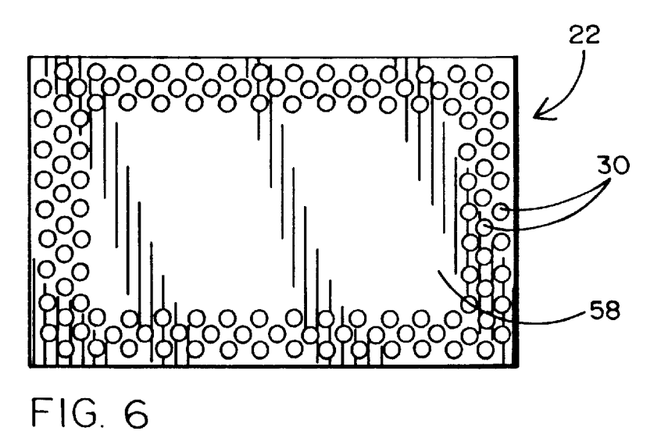

The ceramic body of each layer is formed by lamination of horizontal layers on top of one another, as seen in FIGS. 5 and 7. The laminating process permits various metal conductors, or traces, 38 to be formed which lead from the wire bonds 34 to the vertical vias 36. The traces 38 are formed during the co-firing process. The vias 36 are formed by creating holes, and conductive material is inserted into the vias usually in the form of cylindrical conductors, but the conductors may fill the vias. The laminated ceramic package is formed with a cavity 40, in which the IC chip 26 is placed and bonded to the bottom of the cavity by die attach material 42. The wire bonds 34 are then formed leading from terminals on the chip to aligned traces 38, which in turn lead to the appropriate via conductors 36.

As seen in FIG. 7, there are at least four flat ceramic laminations in the ceramic layer. The lower lamination 44 extends across the entire layer. Successive laminations above the bottom of the layer are open-centered, and are designed to provide exposed shelves for the wire bond terminals, and for the outer edge of lid 28. The layer 46 above layer 44 provides a shelf 48 for the traces 38 to which the wire bonds 34 are connected. The layer 50 above layer 46 provides a shelf 52 against which lid 28 engages. The top layer 54 provides a surface 56 on which are located the terminals (or lands) which constitute the land grid array (LGA).

The use of a ball grid array on the bottom of each layer and a land grid array on the top of each layer permits adjacent layers to be bonded together, because the balls protrude far enough to engage the much thinner lands, compensating for any surface unevenness. An example of relative ball and land thickness would be a 5 mil vertical thickness of the balls and a 1 mil vertical thickness of the lands. The arrangement could be reversed, with the lands on the bottom and the balls on the top. However, the relatively thick terminals are preferably on the bottom for convenience in testing.

The stack of layers shown in FIGS. 1–3 shows the solder connections 24 between layers, in which the aligned ball and land terminals are reflow soldered together. FIG. 3 shows a bottom array of terminals 30, (I/O ports) which do not extend into the center area of the bottom layer. The entire area is available for terminals 30, if desired (see FIG. 17). In a stack of identical layers, e.g., all memory chips, it is easier to manufacture a bottom layer which is identical with the other layers.

However, if the bottom layer encloses a chip, or chips, having higher density I/O requirements, such as an ASIC or microprocessor, the entire bottom surface, including center portion 58, is available for terminals connecting to external circuitry, e.g., terminals on a PC board. In that case, the bottom layer would differ from the other layers, and would have a trace-supporting lamination below the chip-supporting lamination.

Figure 8:
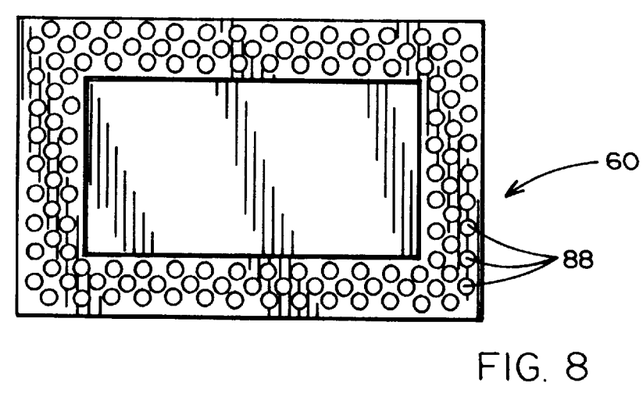
FIGS. 8–10 show, respectively, top, side, and bottom views of a stack of polyimide IC chip-enclosing layers.
Figure 9:
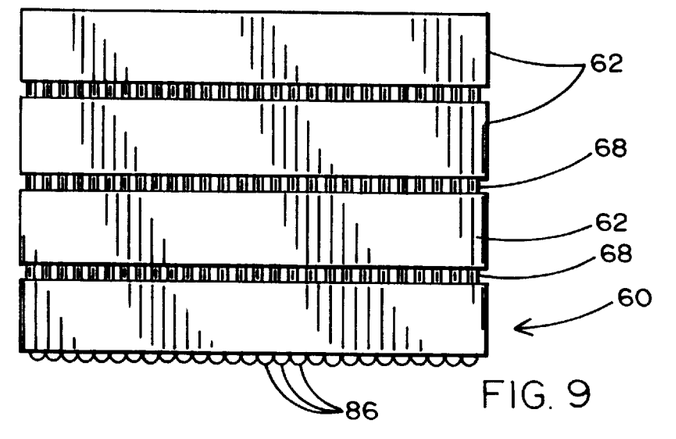
Figure 10:
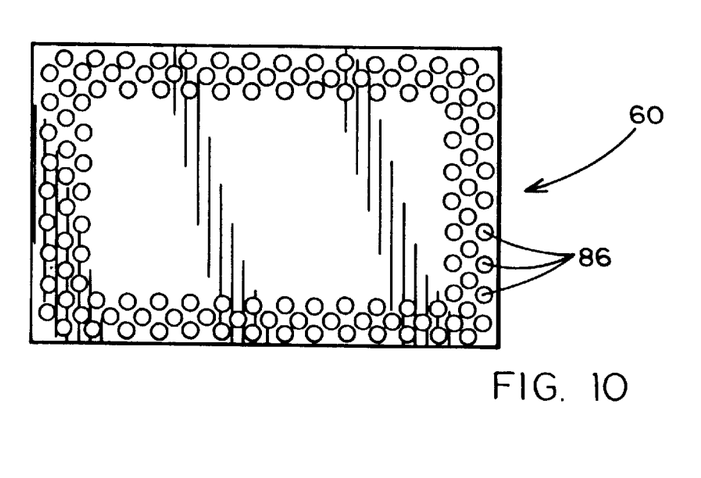
Figure 11:
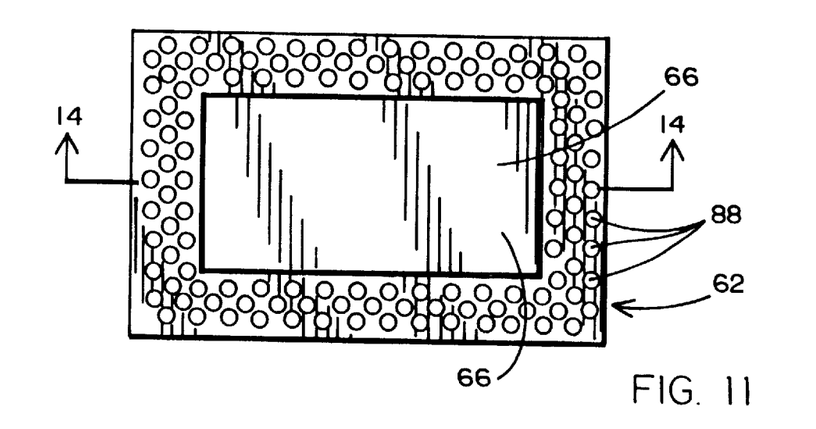
FIGS. 11–14 show, respectively, top, side, bottom, and vertical cross-section views of a single polyimide chip-enclosing layer.
Figure 12:
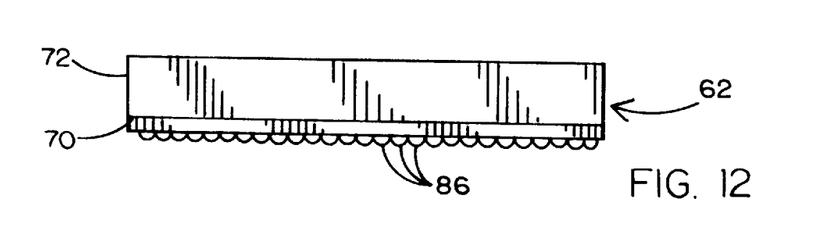
Figure 13:
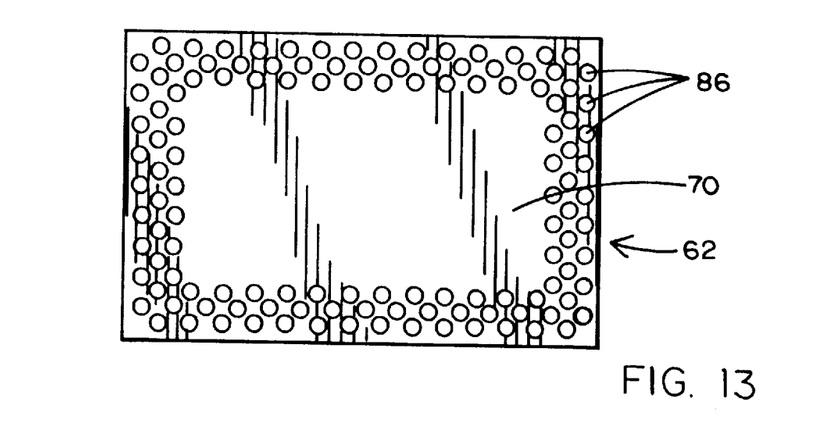
Figure 14:
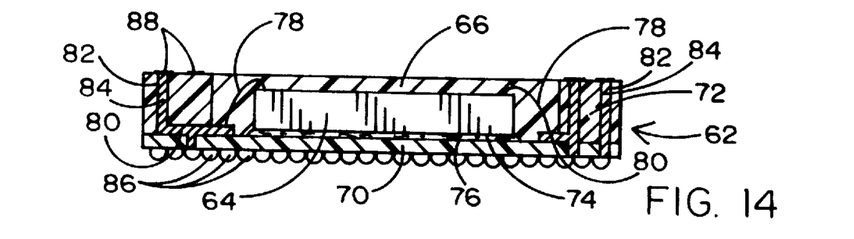

The following is a process flow list of steps in manufacturing the layers and stack using ceramic enclosures:
Attach die to package
Wire bond die pads to package bond pads
Seal metal or ceramic lid to package
Environmentally screen to verify package integrity and hermeticity
Electrically test package
Apply a high melting point solder to BGA pads to form bumps on one or both sides of each package
Stack packages and reflow solder
Electrically test stack FIGS. 8–14 relate to the polyimide version of the invention, which is generally similar to the ceramic version shown in FIGS. 1–7. The polyimide version does not permit hermetic sealing because of the porous nature of the material. FIGS. 8–10 show a stack 60 of polyimide packages (or layers) 62, each of which encloses one or more IC chips 64 (see FIG. 14). The layer-enclosed semiconductor integrated circuits (ICs) are electrically and mechanically interconnected in the vertical direction FIGS. 11–14 show views of a single layer enclosed by polyimide. A difference from the ceramic enclosed layer is that epoxy 66 is used to cover the encapsulated IC chip 64. No lid is needed to enclose the chip.

As in the ceramic version, four polyimide layers 62 are seen in FIG. 9; the number of layers can be varied as desired. The layer-enclosed semiconductor integrated circuits (ICs) are electrically and mechanically interconnected in the vertical direction. The end user of this stack will connect it to a substrate, such as a printed circuit board (PCB). Electrical and mechanical interconnection between adjacent layers is accomplished by solder connections 86, or bumps that include pads with solder material applied thereon.

Each layer 62 is formed of at least two laminations of polyimide material. The bottom lamination 70 extends across the entire layer. The upper lamination 72 is open-centered (i.e., provides a cavity) so that the IC chip can be secured by die attach material 74 to the surface 76 of layer 70 and can have its terminals attached by wire bonds 78 to conductors (traces) 80 formed on the surface 76. Vias 82 having conductive material 84 are used to provide vertical conduction, some via conductors functioning as up/down connect vias, some as through vias, and some as re-route connection vias.

After the IC chip has been installed in the cavity and the conductors have been connected, liquid epoxy is dispensed into the cavity to provide environmental protection for the IC chip. As in the ceramic version, terminals 86 are provided on the bottom of each layer, and terminals 88 are provided on the top of each layer.

The individual chip carrier packages 62 having the IC chip electrical functions are brought out to the top surface and/or the bottom surface of the package and prepared for stacking by printing or dispensing a high melting temperature solder paste on each BGA pad to form a ball and/or land. The melting point of solder should be high enough such that it will not reflow when the end user solders and stack to the substrate. The individual chip carrier packages can then be stacked such that each land on the top surface of each package is aligned with a corresponding ball on the bottom surface of the next higher package. All of the ball-to-land solder connections can be made simultaneously by reflowing the solder in a convection, or vapor phase reflow furnace. The stack so assembled may be soldered to a substrate by the end user. Leads or pins will not be required for stress relief between the stack and the substrate since the coefficient of thermal expansion (CTE) of the polyimide chip carrier is very close to the CTE of most all PCB substrates.

Figure 15:
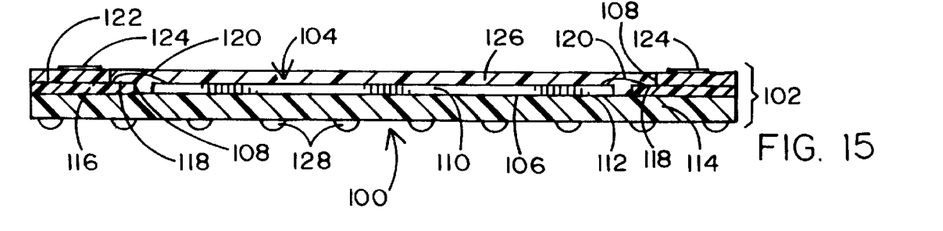
FIGS. 15–17 show, respectively, vertical-cross-section, top, and bottom views of the lower layer of a two-layer stack.
Figure 16:
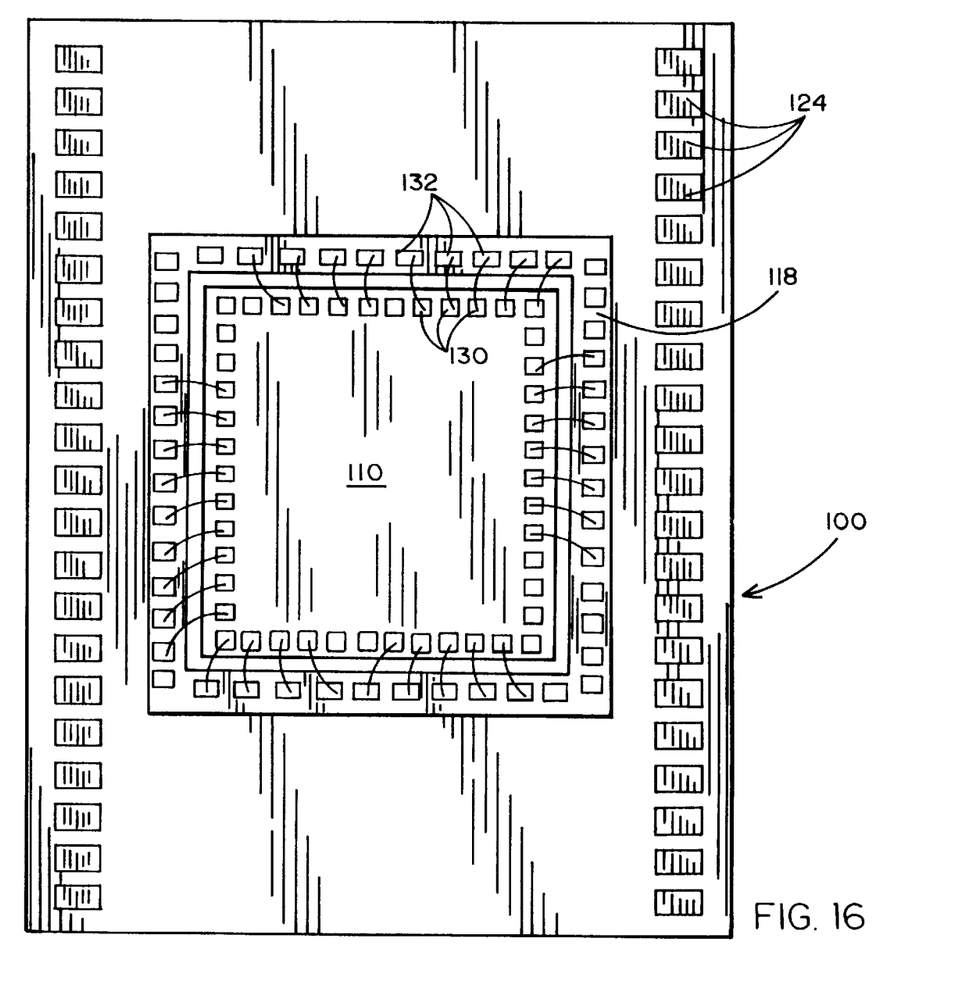
Figure 17:
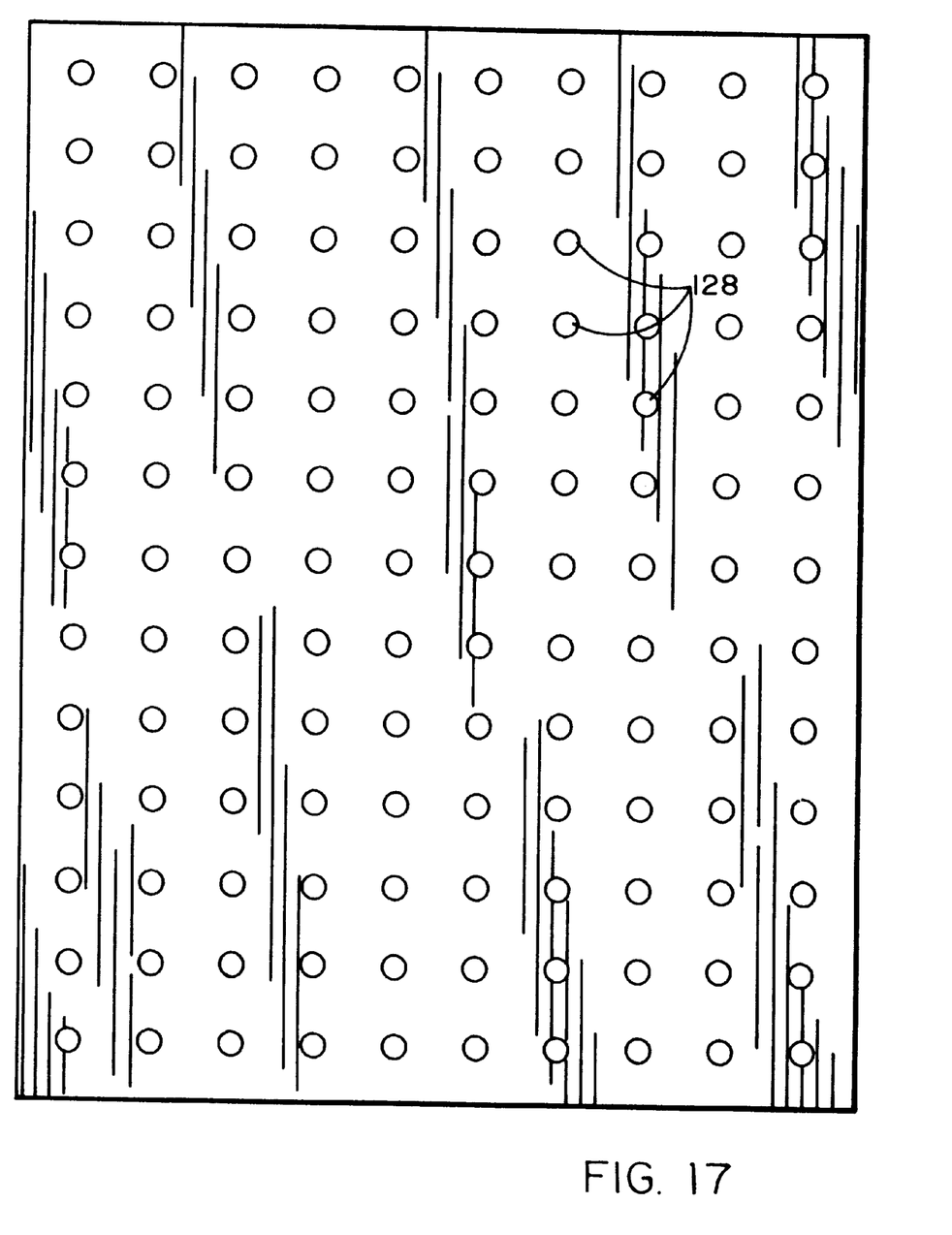

The following is a process flow list of steps in manufacturing the layers and stack using polyimide enclosures:

Attach die to package
Wire bond die pads to package bond pads
Fill die cavity with epoxy
Electrically test package
Apply a high melting point solder to BGA pads to form bumps on one or both sides of each package
Stack packages and reflow solder
Electrically test stack FIGS. 15–19 show a two-layer stack comprising a lower layer enclosing a non-memory IC chip, and an upper layer enclosing a memory chip in a thin small outline package (TSOP), which is an off-the-shelf commercially available enclosed IC chip. FIGS. 15 and 16 are, respectively, a vertical cross-section and a plan view of the lower layer. FIG. 17 is a view of the bottom of the lower layer.

As seen in FIGS. 15 and 16, the lower layer 100 has a container 102 formed of a suitable material, e.g., polyimide. It has a cavity 104 formed by its lower wall 106 and its side walls 108. Inside cavity 104 a non-memory (e.g., ASIC, microprocessor) IC chip 110 is secured to the surface 112 of lower lamination 114. A second lamination 116 provides a wire bond shelf 118 having conductors on the shelf connected by wire bonds 120 to the terminals on IC chip 110. A top lamination 122 supports a multiplicity of terminals 124 to which conductors from the TSOP are connected (soldered).

Epoxy 126 is used to fill cavity 104 and to cover the chip 110 and its electrical connections. Horizontal conductors (traces) and vertical via conductors are used in the same manner as in the other embodiments. The internal conductors lead to terminals 128 on the bottom of layer 100. In order to accommodate a large number of I/O ports, the bottom layer 100, which is shown in FIG. 17, has an array of terminals 128 located throughout the area of the bottom surface. The horizontal conductors leading to the terminals 128 may be formed on the surface 112 of lower lamination 114.

FIG. 16 shows terminals 130 formed on the IC chip 110, which terminals are connected by wire bonds to terminals 132 formed on wire bond shelf 118. FIG. 16 also shows the terminals 124 which are connected to terminals on the TSOP layer.

Figure 18:
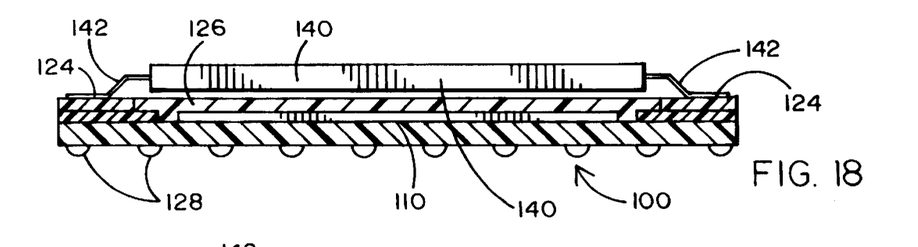
FIGS. 18–19 show, respectively, vertical cross-section, and top views of the two-layer stack.
Figure 19:
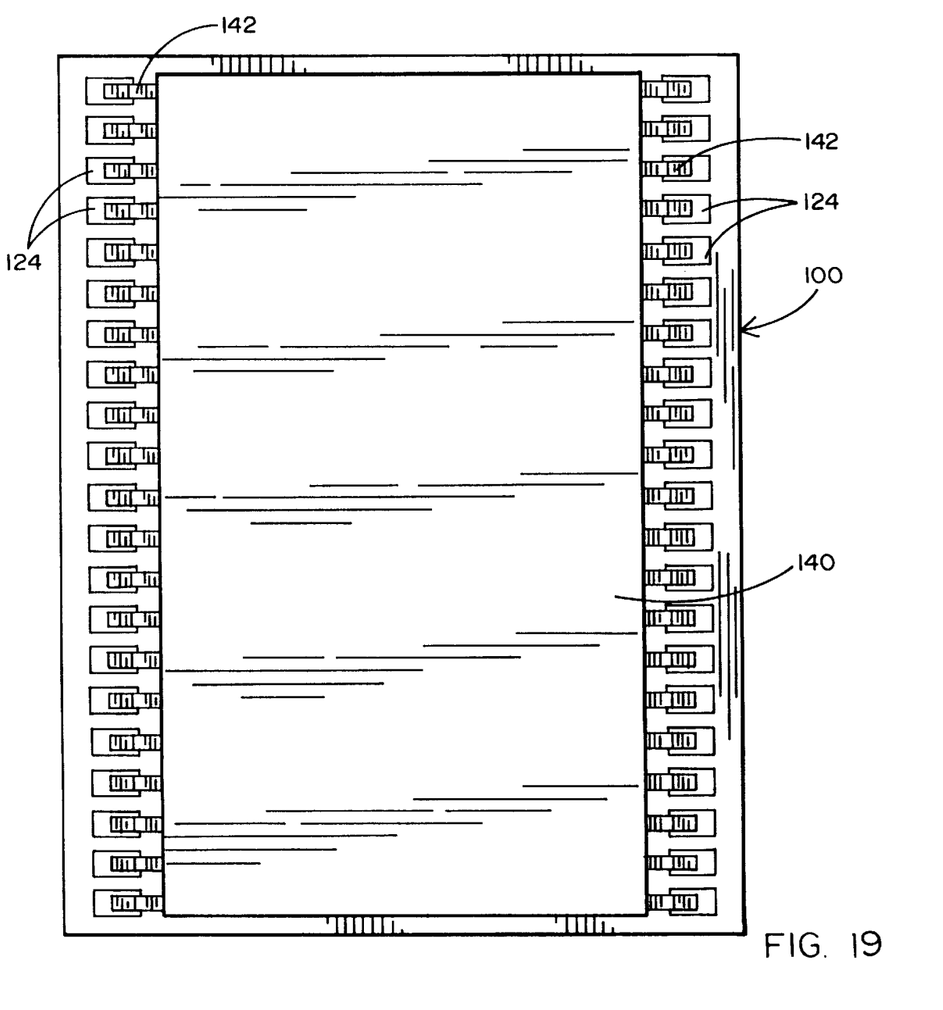

FIGS. 18 and 19 are, respectively, a vertical cross-section and a plan view of the two4ayer stack. A standard off-the-shelf memory TSOP 140, which contains an IC memory chip, is mounted above the non-memory layer 100, and is both supported by, and electrically connected by, a multiplicity of leads 142, each of which is connected to a separate one of the terminals 124 formed on the upper surface of lower layer 100.

The TSOP has been fully tested by its supplier. The lower layer 100 is fully tested before the two layers are interconnected. The reason for leaving a space between the top of lower layer 100 and the TSOP (about a 10 mil gap) is to permit cleaning out of any flux which remains after processing the two-layer stack.

From the foregoing description, it will be apparent that the device and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A stack of IC chip-enclosing layers, comprising:

a first layer having a dielectric body providing a cavity and having via conductors in its wall which electrically connect the top and bottom surfaces of the first layer;

an IC chip inside the first layer cavity having I/O terminals thereon;

an array of low-profile closely-spaced bumps formed on the bottom surface of the first layer adapted to be connected by soldering to external circuitry, each bump comprising a surface mount pad and solder material applied thereon;

electrical connections between the chip terminals and the bumps on the bottom surface of the first layer;

an array of low-profile closely-spaced bumps formed on the top surface of the first layer in the peripheral space outside the area of the cavity, each bump comprising a surface mount pad and solder material applied thereon;

means for enclosing the first layer cavity to permit testing to establish known good quality of the layer prior to stacking, an upper surface of the first layer enclosing means being substantially flush with the top surface of the first layer and the array of low-profile closely-spaced bumps formed on the top surface of the first layer;

a second layer supported on the top of the first layer and having a dielectric body providing a cavity and having via conductors in its wall which electrically connect the top and bottom surfaces of the second layer;

an IC chip inside the second layer cavity having I/O terminals thereon;

means for enclosing the second layer cavity to permit testing to establish known good quality of the second layer prior to stacking;

an array of low-profile closely-spaced bumps formed on the bottom surface of the second layer, in the peripheral space outside the area of the cavity, each bump comprising a surface mount pad and solder material applied thereon;

the bottom surface of the second layer located closely adjacent to the top surface of the first layer with the array of low-profile closely-spaced bumps formed on the bottom surface of the second layer being aligned with and contacting the array of low-profile closely-spaced bumps formed on the top surface of the first layer due to the upper surface of the first layer enclosing means being substantially flush with the top surface of the first layer;

the low-profile closely-spaced bumps on the bottom surface of the second layer being reflow soldered to the low-profile closely-spaced bumps on the top surface of the first layer, adjacent to the upper surface of the first layer enclosing means that is substantially flush with the top surface of the first layer in such a way that the soldering process insures connection of the two sets of bumps regardless of any surface unevenness of the adjacent surfaces of the first and second layers.

2. The structure of claim 1 in which:

the IC chip enclosed in the first layer is a non-memory chip; and the IC chip enclosed in the second layer is a memory chip.

3. The structure of claim 1 in which the bumps on the bottom surface of the first layer comprise an array of bumps located substantially throughout a full central area of said surface beneath the first cavity.

4. A stack of IC chip-enclosing layers including a bottom layer and at least one upper layer, the stack comprising:

a dielectric body of each layer providing a cavity and having via conductors in its cavity-enclosing wall which are electrical connections between the top and bottom surfaces of the layer;

an IC chip inside the cavity of each layer, the IC chip having I/O terminals thereon;

means above the IC chip for closing the cavity of each layer in order to permit layer testing to establish known good quality of each layer prior to stacking;

a partial array of low-profile, closely-spaced bumps, each comprising a surface mount pad and solder material applied thereon, formed along a perimeter on the top surface of each upper layer adapted to be soldered to aligned low-profile, closely-spaced bumps, each comprising a surface mount pad and solder material applied thereon, formed along a corresponding perimeter on the bottom surface of the next higher layer;

a partial array of low-profile, closely-spaced bumps, each comprising a surface mount pad and solder material applied thereon, formed along a perimeter on the bottom surface of each upper layer adapted to be soldered to aligned low-profile, closely-spaced bumps, each comprising a surface mount pad and solder material applied thereon, formed along a corresponding perimeter on the top surface of the next lower layer;

a full array of low-profile, closely-spaced bumps, each comprising a surface mount pad and solder material applied thereon, formed on the bottom surface of the bottom layer in the stack; and electrical connections between the I/O terminals on each IC chip and bumps on the bottom of its layer.

5. The structure of claim 4 in which:

the dielectric body of each layer is ceramic; and a cover is mounted over the cavity to hermetically seal the IC chip enclosure.

6. The structure of claim 4 in which:

the dielectric body of each layer is polyimide; and epoxy material is located above the IC chip to close the cavity.

7. The structure of claim 4 in which:

the electrical connections in each layer include horizontal conductor traces connecting the I/O terminals on the enclosed IC chip to the via conductors.

8. The structure of claim 4 in which:

the dielectric body of each layer includes a plurality of laminations; and horizontally-extending conductors are located between adjacent laminations.

9. The structure of claim 4 wherein the IC chip inside the cavity of the bottom layer is a high I/O count IC and wherein the IC chips inside the cavity of each upper layer contains a memory IC.

* * * * *